(12) United States Patent
Seon

(10) Patent No.: US 12,087,535 B2
(45) Date of Patent: Sep. 10, 2024

(54) FLEXIBLE PRINTED CIRCUIT BOARD (FPCB) AND METHOD FOR MANUFACTURING THE SAME

(71) Applicant: LG Energy Solution, Ltd., Seoul (KR)

(72) Inventor: Sang Ok Seon, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 133 days.

(21) Appl. No.: 17/920,303

(22) PCT Filed: Jul. 14, 2021

(86) PCT No.: PCT/KR2021/009050
§ 371 (c)(1),
(2) Date: Oct. 20, 2022

(87) PCT Pub. No.: WO2022/025489
PCT Pub. Date: Feb. 3, 2022

(65) Prior Publication Data
US 2023/0253174 A1   Aug. 10, 2023

(30) Foreign Application Priority Data

Jul. 28, 2020  (KR) .................. 10-2020-0094041

(51) Int. Cl.
| | | |
|---|---|---|
| H01H 85/08 | (2006.01) | |
| H01H 69/02 | (2006.01) | |
| H01H 85/046 | (2006.01) | |
| H01H 85/06 | (2006.01) | |
| H01H 85/143 | (2006.01) | |

(52) U.S. Cl.
CPC ......... *H01H 85/08* (2013.01); *H01H 69/022* (2013.01); *H01H 85/046* (2013.01); *H01H 85/06* (2013.01); *H01H 85/143* (2013.01)

(58) Field of Classification Search
CPC .......................... H01H 69/022; H01H 85/046
See application file for complete search history.

(56) References Cited

U.S. PATENT DOCUMENTS 3,913,219 A * 10/1975 Lichtblau ............. H03H 5/02
29/25.42
4,388,603 A   6/1983 Hassler
(Continued)

FOREIGN PATENT DOCUMENTS

CN   001104181 C   3/2003
CN   203691758 U   7/2014
(Continued)

OTHER PUBLICATIONS

Extended European Search Report including Written Opinion for Application No. 21849866.5 dated Aug. 28, 2023, pp. 1-7.
(Continued)

*Primary Examiner* — Stephen S Sul
(74) *Attorney, Agent, or Firm* — Lerner David LLP

(57) ABSTRACT

A flexible printed circuit board (FPCB) including a pattern circuit layer. The pattern circuit layer has a pattern fuse embedded therein, and the pattern fuse includes a first conductive wire made of a metal and having a spiral structure, and a second conductive wire made of a metal and having a spiral structure. The first conductive wire and the second conductive wire have a double helix structure.

20 Claims, 14 Drawing Sheets

(56) References Cited

U.S. PATENT DOCUMENTS

| | | | | |
|---|---|---|---|---|
| 4,734,670 | A | * | 3/1988 | Westrom ............... H01H 85/06 337/159 |
| 5,099,219 | A | | 3/1992 | Roberts |
| 5,367,281 | A | * | 11/1994 | Crooks ............... H01H 85/303 337/417 |
| 5,586,014 | A | | 12/1996 | Hasegawa |
| 5,923,239 | A | * | 7/1999 | Krueger ............... H05K 1/0293 337/296 |
| 9,854,671 | B1 | | 12/2017 | Lin et al. |
| 2002/0101323 | A1 | | 8/2002 | Ranjan |
| 2004/0190269 | A1 | * | 9/2004 | Makaran ............... H05K 1/0293 361/748 |
| 2007/0035033 | A1 | | 2/2007 | Ozguz |
| 2008/0100411 | A1 | * | 5/2008 | Tofigh ............... H01H 85/463 337/182 |
| 2008/0135281 | A1 | * | 6/2008 | Zhang ............... H05K 1/0293 174/250 |
| 2011/0279218 | A1 | * | 11/2011 | Salonga ............... H01H 85/055 337/187 |
| 2013/0119555 | A1 | | 5/2013 | Sundaram |
| 2015/0303131 | A1 | | 10/2015 | Poelma |
| 2016/0141257 | A1 | | 5/2016 | Sundaram |
| 2018/0198110 | A1 | | 7/2018 | Zeng |
| 2019/0006141 | A1 | * | 1/2019 | Tsumagari ........... H05K 1/0296 |
| 2020/0196442 | A1 | * | 6/2020 | Woodley ............... H05K 1/0293 |
| 2020/0203777 | A1 | | 6/2020 | Wang |

FOREIGN PATENT DOCUMENTS

| | | | |
|---|---|---|---|
| CN | 108289372 | A | 7/2018 |
| CN | 105704921 | B | 1/2019 |
| CN | 209608955 | U | 11/2019 |
| CN | 209787546 | U | 12/2019 |
| JP | H08045413 | A | 2/1996 |
| JP | H11096887 | A | 4/1999 |
| JP | H11186039 | A | 7/1999 |
| JP | 2006054207 | A | 2/2006 |
| JP | 2007018774 | A | 1/2007 |
| JP | 2012084393 | A | 4/2012 |
| JP | 2013258393 | A | 12/2013 |
| JP | 5536973 | B2 | 7/2014 |
| JP | 2016154240 | A | 8/2016 |
| KR | 20060068964 | A | 6/2006 |
| KR | 100675296 | B1 | 1/2007 |
| KR | 20130087149 | A | 8/2013 |
| KR | 101546190 | B1 | 8/2015 |
| KR | 20150103719 | A | 9/2015 |
| KR | 101845714 | B1 | 4/2018 |
| KR | 101944007 | B1 | 1/2019 |
| KR | 102187077 | B1 | 12/2020 |

OTHER PUBLICATIONS

International Search Report for PCT/KR2021/009050 mailed Nov. 1, 2021. 3 pgs.

* cited by examiner

FLEXIBLE PRINTED CIRCUIT BOARD (FPCB) AND METHOD FOR MANUFACTURING THE SAME

CROSS-REFERENCE TO RELATED APPLICATIONS

The present application is a national phase entry under 35 U.S.C. § 371 of International Application No. PCT/KR2021/009050 filed Jul. 14, 2021, which claims priority from Korean Patent Application No. 10-2020-0094041, filed on Jul. 28, 2020, all of which are incorporated herein by reference.

TECHNICAL FIELD

The present invention relates to a flexible printed circuit board (FPCB) and a method for manufacturing the same, and more specifically, to an FPCB which does not require a fuse to be mounted thereon, thereby reducing the total volume and saving costs, and a method for manufacturing the same.

BACKGROUND ART

A printed circuit board (PCB) is widely used in various electronic products such as TVs, computers, mobile phones, displays, communication networks, and semiconductor modules. As a type of such PCB, a flexible printed circuit board (FPCB) with flexibility in particular has recently been widely used.

In general, an FPCB is manufactured by laminating a copper foil on a polyimide film to form a copper clad laminate, laminating a dry film thereon to form a conductor pattern though exposure, development, and etching processes, and then attach a cover lay on the outermost copper foil. The FPCB is installed in a bent state inside a complex product case by utilizing the flexibility of raw materials or is used at a repeatedly moving portion, and due to the properties thereof, is used in various manners in miniaturization (digital cameras, camcorders, etc.), flexibility (printer heads, hard disks, etc.), high-density wires (precision instruments such as medical devices), and rationalization of assembly (measuring instruments, vehicle electronics, battery modules, etc.).

The FPCB is formed by etching and the like, and thus, does not occupy a large volume, and does not frequently cause problems such as disconnection due to an external impact. However, elements such as a fuse are mounted on the FPCB separately through a mounting process after the FPCB is completely manufactured. Therefore, there have been problems in that the total volume of the FPCB increases, and costs also increase.

PRIOR ART DOCUMENT (Patent Document 1) Korean Patent Publication No. 1845714

DISCLOSURE OF THE INVENTION

Technical Problem

An object of the present invention for solving the above problems is to provide an FPCB which does not require a fuse to be mounted thereon, thereby reducing the total volume and saving costs, and a method for manufacturing the same.

Problems to be solved by the present invention are not limited to the above-mentioned problem, and other problems that are not mentioned may be apparent to those skilled in the art from the following description.

Technical Solution

In an FPCB including a pattern circuit layer according to an embodiment of the present invention for achieving the above objects, the pattern circuit layer has a pattern fuse embedded therein, and the pattern fuse includes: a first conductive metal wire; and a second conductive metal wire, wherein the first conductive metal wire and the second conductive metal wire are arranged in a double helix structure.

In addition, the first conductive metal wire may include: a first lower conductive wire positioned on a bottom surface of the pattern circuit layer; a first upper conductive wire positioned on a top surface of the pattern circuit layer; and a first via conductive wire connecting the first lower conductive wire and the first upper conductive wire to each other, and the second conductive metal wire may include: a second lower conductive wire positioned on the bottom surface of the pattern circuit layer; a second upper conductive wire positioned on the top surface of the pattern circuit layer; and a second via conductive wire connecting the second lower conductive wire and the second upper conductive wire to each other.

In addition, each of the first conductive metal wire and the second conductive metal wire is arranged in a helical quadrangular shape.

In addition, each of the first lower conductive wire, the second lower conductive wire, the first upper conductive wire, and the second upper conductive wire may be straight.

In addition, each of the first via conductive wire and the second via conductive wire may be straight and extends longitudinally in a thickness direction of the pattern circuit layer.

In addition, each of the first conductive wire and the second conductive wire may have a start terminal and an end terminal, wherein each start terminal and each end terminal is exposed on only one of a top surface or a bottom surface of the pattern circuit layer.

In addition, the start terminal of the first conductive metal wire and the start terminal of the second conductive metal wire may be spaced apart from each other, and the end terminal of the first conductive metal wire and the end terminal of the second conductive metal wire may spaced apart from each other.

In addition, the start terminal of the first conductive metal wire and the start terminal of the second conductive metal wire may be connected to each other, and the end terminal of the first conductive metal wire and the end terminal of the second conductive metal wire may be connected to each other.

In addition, each of the start terminals may be connected to a power bus bar and each of the end terminals may be connected to a sensing bus bar.

In addition, the end terminal of the first conductive metal wire may be connected to a first sensing bus bar, and the end terminal of the second conductive metal wire may be connected to a second bus bar.

In addition, each of the first conductive metal wire and the second conductive metal wire may include at least one of silver, copper, gold, or aluminum.

In addition, the FPCB may further include a cover lay laminated on a top surface of the pattern circuit layer.

A method for manufacturing an FPCB according to an embodiment of the present invention for achieving the above objects includes: forming a first lower conductive wire and a second lower conductive wire on a top surface of a base film; exposing both ends of the first lower conductive wire and the second lower conductive wire, and laminating a micro-pillar on the top surface of the base film; forming a first via conductive wire and a second via conductive wire on both the ends of the first lower conductive wire and the second lower conductive wire, respectively; injecting a filler into an empty space in which the micro-pillar is not filled on the top surface of the base film; and forming a first upper conductive wire connecting the first via conductive wires to each other and a second upper conductive wire connecting the second via conductive wires to each other on a top surface of the micro-pillar.

In addition, the first lower conductive wire and the second lower conductive wire may be formed parallel to a first direction.

In addition, the first upper conductive wire and the second upper conductive wire may be formed parallel to a second direction.

In addition, the first direction and the second direction may be different from each other.

In addition, the first lower conductive wire and the second lower conductive wire may be formed on the top surface of the base film by at least one of an etching or printing method.

In addition, the first upper conductive wire and the second upper conductive wire may be formed on the top surface of the micro-pillar by at least one of an etching or printing method.

In addition, the method may further include forming a first start terminal at a start portion of a first conductive wire comprising the first lower conductive wire, the first via conductive wires, and the first upper conductive wire; forming a first end terminal at an end portion of the first conductive wire; forming a second start terminal at a start portion of a second conductive wire comprising the second lower conductive wire, the second via conductive wires, and the second upper conductive wire; and forming an second end terminal at an end portion of the second conductive wire.

In addition, the first and second start terminals and the first and second end terminals are formed such that they are exposed only on one of a top surface or a bottom surface of a pattern circuit layer.

Other specific details of the present invention are included in the detailed description and drawings.

Advantageous Effects

According to the embodiments of the present invention, there are at least the following effects.

Since the pattern fuse having the double helix structure is formed on the FPCB using the through polymer via (TPV) method rather than the mounting method and the like, it is possible to reduce the total volume of the FPCB and save the costs.

Effects according to the present invention are not limited by the contents exemplified above, and more various effects are included herein.

MODE FOR CARRYING OUT THE INVENTION

Figure 1:
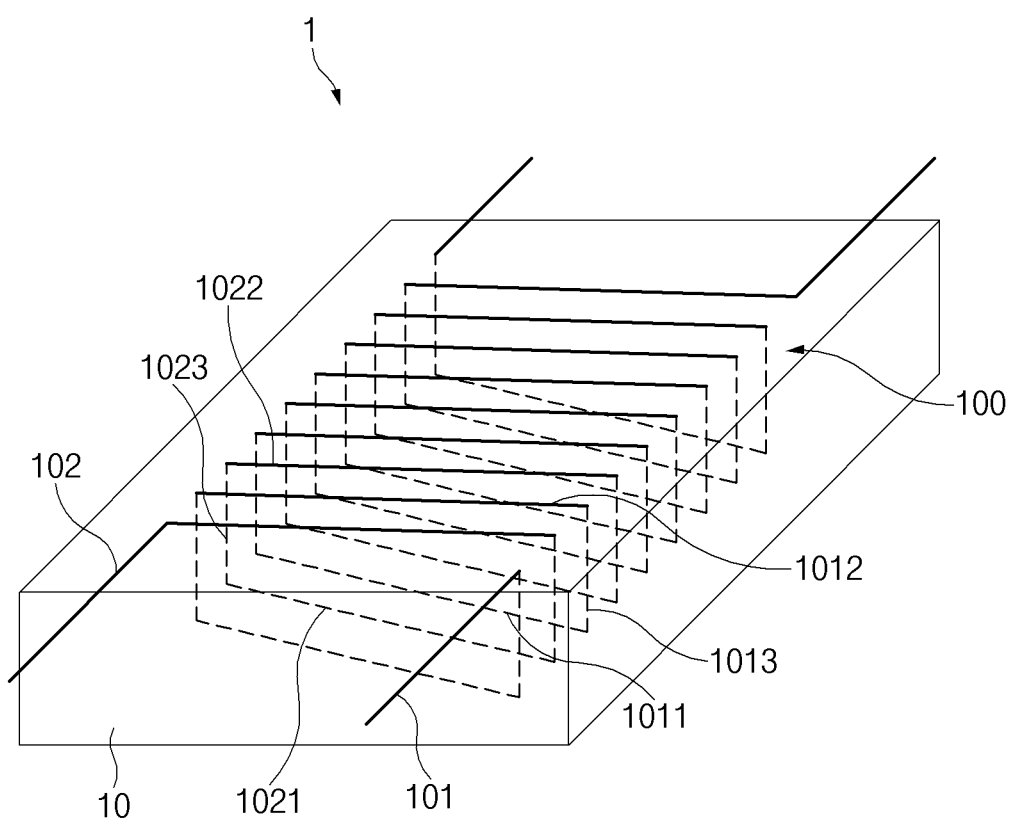
FIG. 1 is a perspective view of a FPCB 1 which has a pattern fuse 100 embedded therein according to an embodiment of the present invention.

Advantages and features of the inventive concept and methods of accomplishing the same may be understood more readily by reference to the following detailed description of exemplary embodiments and the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art to which the inventive concept pertains. The inventive concept will only be defined by the appended claims. The same reference numerals refer to like elements throughout the specification.

Unless otherwise defined, all the terms used herein (including technical and scientific terms) will be used in a sense that can be commonly understood to those of ordinary skill in the art to which the inventive concept pertains. In addition, the terms that are defined in a commonly used dictionary are not interpreted ideally or excessively unless specifically defined.

The terms used herein are for the purpose of describing embodiments and are not intended to be limiting of the present invention. In the present disclosure, singular forms include plural forms unless the context clearly indicates otherwise. As used herein, the terms "comprises" and/or "comprising" are intended to be inclusive of the stated elements, and do not exclude the possibility of the presence or the addition of one or more other elements.

Hereinafter, preferred embodiments of the present invention will be described in detail with reference to the accompanying drawings.

FIG. 1 is a perspective view of a FPCB 1 which has a pattern fuse 100 embedded therein according to an embodiment of the present invention.

According to an embodiment of the present invention, since the pattern fuse 100 having a double helix structure is formed on the FPCB 1 using a through polymer via (TPV) method rather than a mounting method and the like, it is possible to reduce the total volume of the FPCB 1 and save costs.

To this end, in the FPCB 1 including a pattern circuit layer 10 according to an embodiment of the present invention, the pattern circuit layer 10 has the pattern fuse 100 embedded therein, and the pattern fuse 100 includes a first conductive wire 101 made of a metal and spirally formed, and a second conductive wire 102 made of a metal and spirally formed. The first conductive wire 101 and the second conductive wire 102 have a double helix structure.

As illustrated in FIG. 1, the pattern fuse 100 according to an embodiment of the present invention includes the first conductive wire 101 and the second conductive wire 102. The first conductive wire 101 is made of a metal, and is embedded in the pattern circuit layer 10 of the FPCB 1. In addition, the second conductive wire 102 is also made of a metal, and is embedded in the pattern circuit layer 10 of the FPCB 1. Both the first conductive wire 101 and the second conductive wire 102 have spiral structures, and particularly, a double helix structure.

Specifically, the first conductive wire 101 includes a first lower conductive wire 1011, a first upper conductive wire 1013, and a first via conductive wire 1012. The first lower conductive wire 1011 is formed to have a linear shape on a bottom surface of the pattern circuit layer 10, and the first upper conductive wire 1013 is formed to have a linear shape on a top surface of the pattern circuit layer 10. In addition, the first via conductive wire 1012 connects the first lower conductive wire 1011 and the first upper conductive wire 1013 to each other, and is formed to have a linear shape in a thickness direction on the pattern circuit layer 10. Since the first lower conductive wire 1011, the first upper conductive wire 1013, and the first via conductive wire 1012 each have the linear shape as described above, the first conductive wire 101 may have a quadrangular shape. In addition, since the first lower conductive wire 1011, the first via conductive wire 1012, and the first upper conductive wire 1013 are sequentially connected and repeatedly formed, the first conductive wire 101 may have the spiral structure.

In the same manner, the second conductive wire 102 includes a second lower conductive wire 1021, a second upper conductive wire 1023, and a second via conductive wire 1022. The second lower conductive wire 1021 is formed to have a linear shape on the bottom surface of the pattern circuit layer 10, and the second upper conductive wire 1023 is formed to have a linear shape on the top surface of the pattern circuit layer 10. In addition, the second via conductive wire 1022 connects the second lower conductive wire 1021 and the second upper conductive wire 1023 to each other, and is formed to have a linear shape in the thickness direction on the pattern circuit layer 10. Since the second lower conductive wire 1021, the second upper conductive wire 1023, and the second via conductive wire 1022 each have the linear shape as described above, the second conductive wire 102 may have a quadrangular shape. In addition, since the second lower conductive wire 1021, the second via conductive wire 1022, and the second upper conductive wire 1023 are sequentially connected and repeatedly formed, the second conductive wire 102 may have the spiral structure.

The first conductive wire 101 and the second conductive wire 102 are not separately formed, but rather spirally formed in the state of overlapping each other, that is, have the double helix structure. In addition, the metal for forming the first conductive wire 101 and the second conductive wire 102 may include at least one of silver, copper, gold, or aluminum which has high electrical conductivity, and particularly, may preferably include copper, which is easy to be molded, has a low price, and is economical.

Figure 2:
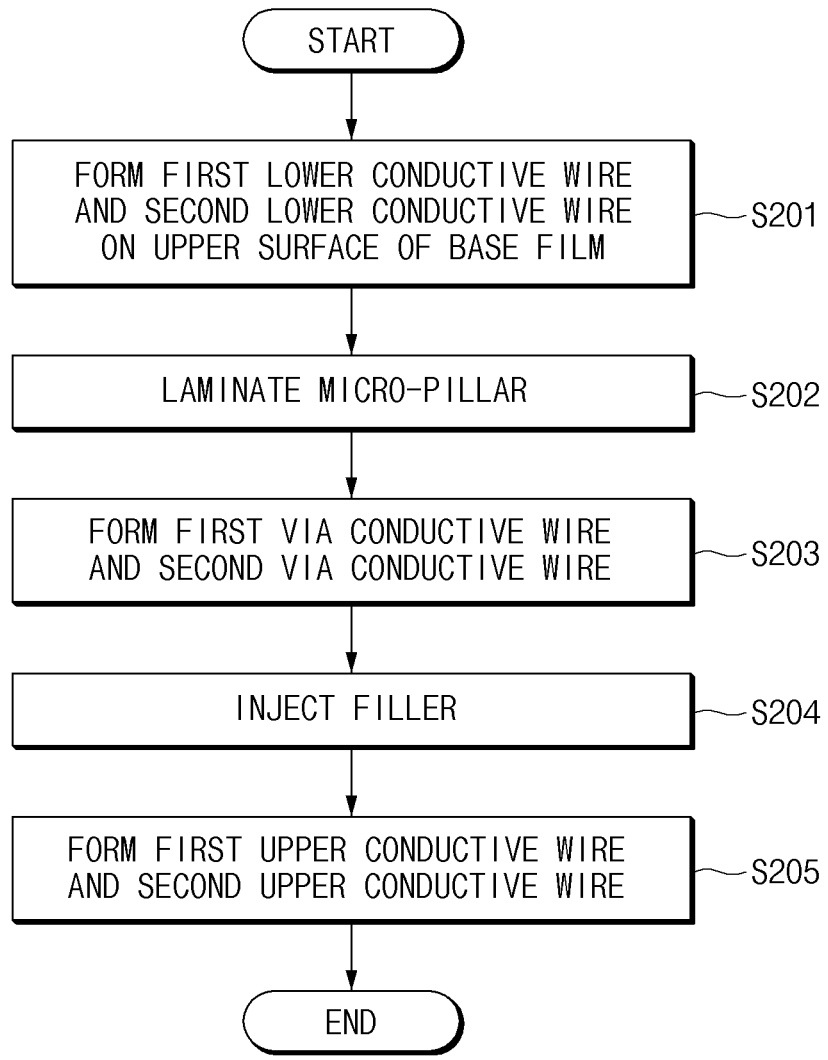
FIG. 2 is a flowchart illustrating a method for manufacturing the FPCB 1 which has the pattern fuse 100 embedded therein according to an embodiment of the present invention.

FIG. 2 is a flowchart illustrating a method for manufacturing the FPCB 1 which has the pattern fuse 100 embedded therein according to an embodiment of the present invention.

A method for manufacturing the FPCB 1 according to an embodiment of the present invention includes a process of forming a first lower conductive wire 1011 and a second lower conductive wire 1021 on a top surface of a base film 11; a process of exposing both ends of the first lower conductive wire 1011 and the second lower conductive wire 1021, and laminating a micro-pillar 103 on the top surface of the base film 11; a process of forming the first via conductive wire 1012 and the second via conductive wire 1022 on both the ends of the first lower conductive wire 1011 and the second lower conductive wire 1021, respectively; a process of injecting a filler 104 into an empty space in which the micro-pillar 103 is not filled on the top surface of the base film 11, and a process of forming the first upper conductive wire 1013 connecting the first via conductive wires 1012 to each other and the second upper conductive wire 1023 connecting the second via conductive wires 1022 to each to other on a top surface of the micro-pillar 103.

Hereinafter, each step illustrated in the flow chart of FIG. 2 will be described in detail with reference to FIG. 3 to FIG. 10.

Figure 3:
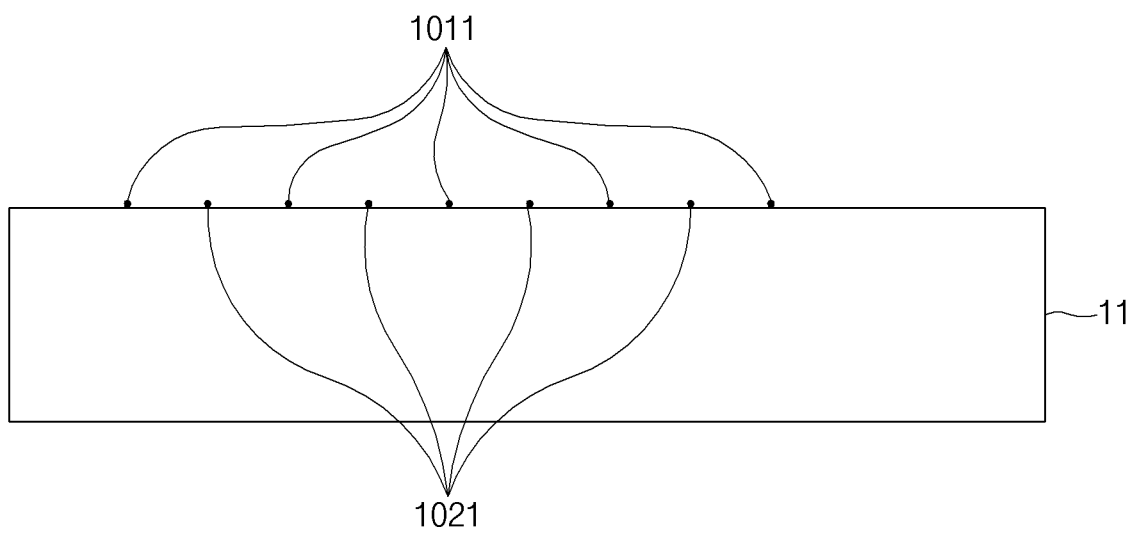
FIG. 3 is a schematic side view illustrating a state in which a first lower conductive wire 1011 and a second lower conductive wire 1021 are formed on a base film 11 according to an embodiment of the present invention.
Figure 4:
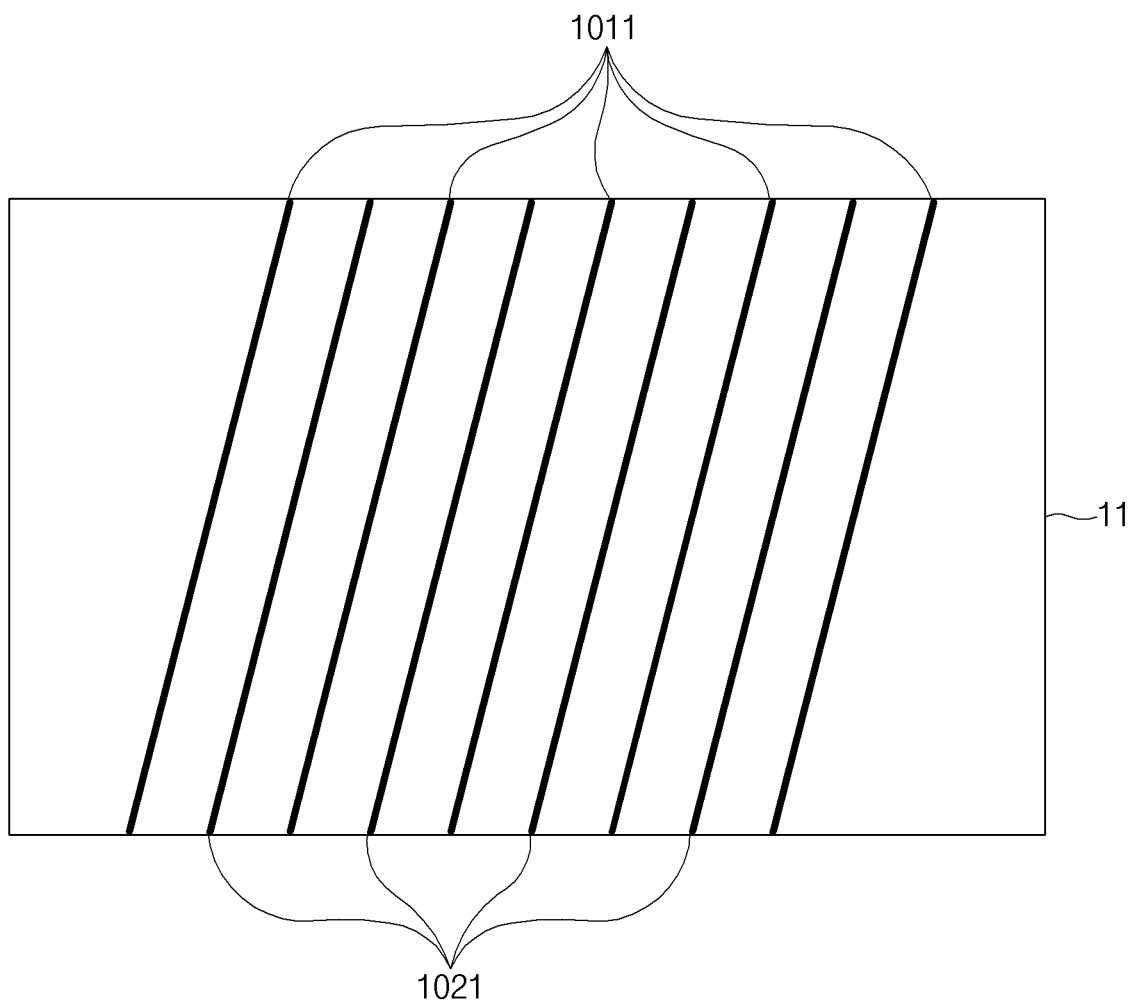
FIG. 4 is a schematic top view illustrating the state in which the first lower conductive wire 1011 and the second lower conductive wire 1021 are formed on the base film 11 according to an embodiment of the present invention.

FIG. 3 is a schematic side view illustrating a state in which a first lower conductive wire 1011 and a second lower conductive wire 1021 are formed on a base film 11 according to an embodiment of the present invention, and FIG. 4 is a schematic top view illustrating the state in which the first lower conductive wire 1011 and the second lower conductive wire 1021 are formed on the base film 11 according to an embodiment of the present invention.

First, the base film 11 is prepared, and as illustrated in FIG. 3, the first lower conductive wire 1011 and the second lower conductive wire 1021 are formed on an top surface of the base film 11 (S201). The base film 11 may be a film containing silicon. In addition, the first lower conductive wire 1011 and the second lower conductive wire 1021 may be formed on the top surface of the base film 11 by at least one of an etching or printing method.

The first lower conductive wire 1011 and the second lower conductive wire 1021 are each provided in plurality, and may be formed parallel to a first direction. In addition, the first direction may have, for example, as illustrated in FIG. 4, a predetermined inclination with respect to the base film 11. In addition, the first lower conductive wire 1011 and the second lower conductive wire 1021 may be alternately formed with each other. Therefore, later, the first conductive wire 101 and the second conductive wire 102 may have the double helix structure.

Figure 5:
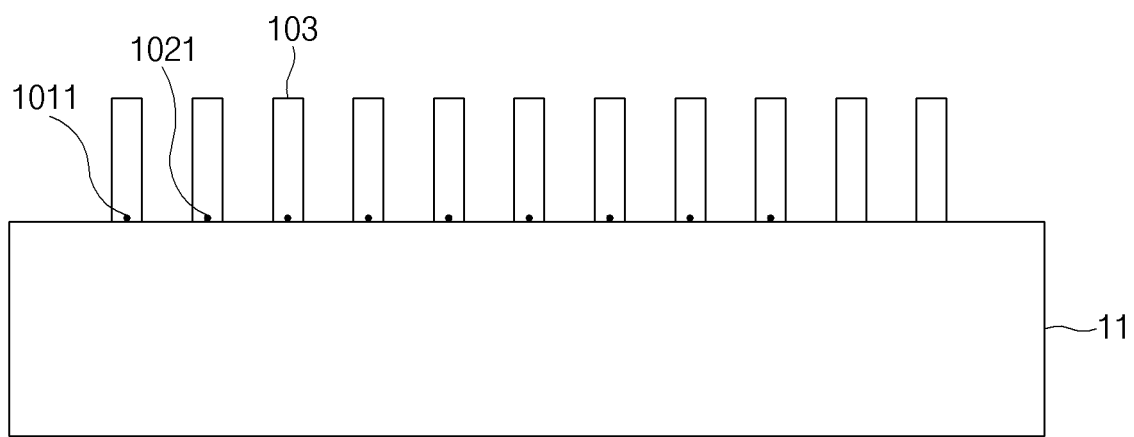
FIG. 5 is a schematic side view illustrating a state in which a micro-pillar 103 is formed on the base film 11 according to an embodiment of the present invention.
Figure 6:
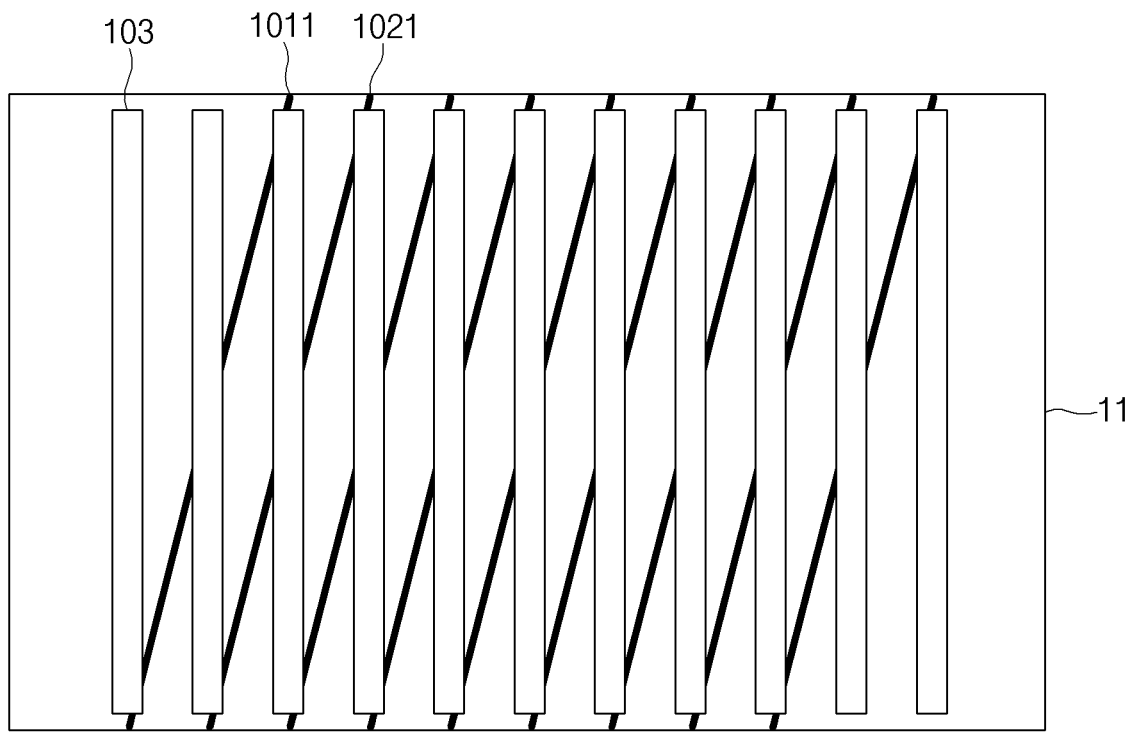
FIG. 6 is a schematic top view illustrating the state in which the micro-pillar 103 is formed on the base film 11 according to an embodiment of the present invention.

FIG. 5 is a schematic side view illustrating a state in which a micro-pillar 103 is formed on the base film 11 according to an embodiment of the present invention, and FIG. 6 is a schematic top view illustrating the state in which the micro-pillar 103 is formed on the base film 11 according to an embodiment of the present invention.

When the first lower conductive wire 1011 and the second lower conductive wire 1021 are formed, both the ends of the first lower conductive wire 1011 and the second lower conductive wire 1021 are exposed as illustrated in FIG. 5, and the micro-pillar 103 is laminated on the top surface of the base film 11 (S202). At this time, the micro-pillar 103 are provided in plurality, and as illustrated in FIG. 6, and may be formed parallel to a second direction which is different from the first direction. In addition, later, the first upper conductive wire 1013 and the second upper conductive wire 1023 are formed along the micro-pillar 103. Therefore, ends of different first lower conductive wires 1011 may be disposed on both the ends of one micro-pillar 103, respectively, or ends of different second lower conductive wires 1021 may be disposed on both the ends of one micro-pillar 103, respectively.

In order to laminate the micro-pillar 103, a thick photoresist may be first laminated and then patterned. The micro-pillar 103 may be an epoxy-based SU-8 negative photoresist which is crosslinked by ultraviolet rays and of which remaining portions are washed to facilitate the patterning.

Meanwhile, although not shown in the drawings, after the micro-pillar 103 is laminated, a separate seed layer may be formed to activate the micro-pillar 103. In order to form the seed layer, a physical vapor deposition (PVD) method may be used, or an atomic layer deposition (ALD) method may be used. In addition, the seed layer may include nitride titanium (TiN) having electrical conductivity, good adhesion to a metal, and a low processing temperature.

Figure 7:
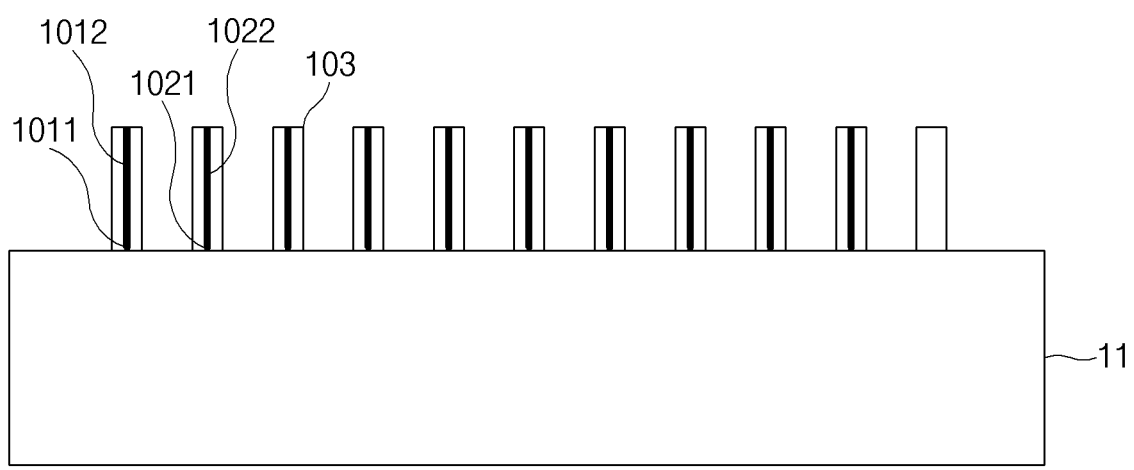
FIG. 7 is a schematic side view illustrating a state in which a first via conductive wire 1012 and a second via conductive wire 1022 are formed on the base film 11 according to an embodiment of the present invention.

FIG. 7 is a schematic side view illustrating a state in which a first via conductive wire 1012 and a second via conductive wire 1022 are formed on the base film 11 according to an embodiment of the present invention.

After the micro-pillar 103 is laminated, the first via conductive wire 1012 and the second via conductive wire 1022 may be respectively formed at both the ends of the first lower conductive wire 1011 and the second lower conductive wire 1021 S203. As described above, ends of different first lower conductive wires 1011 may be disposed on both the ends of the micro-pillar 103, respectively, or ends of different second lower conductive wire 1021 may be disposed on both the ends of the micro-pillar 103, respectively. Therefore, when the first via conductive wire 1012 and the second via conductive wire 1022 are formed, as illustrated in FIG. 7, the first via conductive wire 1012 and the second via conductive wire 1022 may be formed along sidewalls of both the ends of the micro-pillar 103.

In order to form the first via conductive wire 1012 and the second via conductive wire 1022, the micro-pillar 103 may be subjected to electroless plating with a metal such as copper. In addition, in order to prevent corrosion of the metal, electrolytic plating may be additionally performed with a metal having low ionization tendency.

Each of the first via conductive wire 1012 and the second via conductive wire 1022 is also made of a metal, and when the first conductive wire 1013 and the second conductive wire 1023 are formed later, the first via conductive wire 1012 and the second via conductive wire 1022 respectively connect the lower conductive wires 1011 and 1021 and the upper conductive wires 1021 and 1022, and thus, serve as a through electrode configured to electrically connect the bottom surface and the top surface of the pattern circuit layer 10 to each other.

Figure 8:
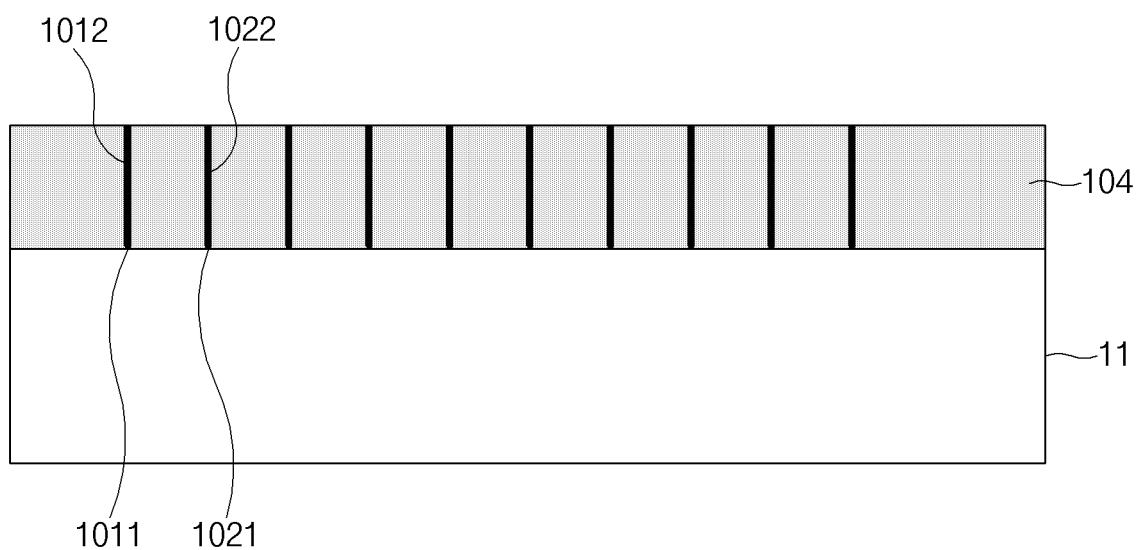
FIG. 8 is a schematic side view illustrating a state in which a filler 104 is injected into the base film 11 according to an embodiment of the present invention.
Figure 9:
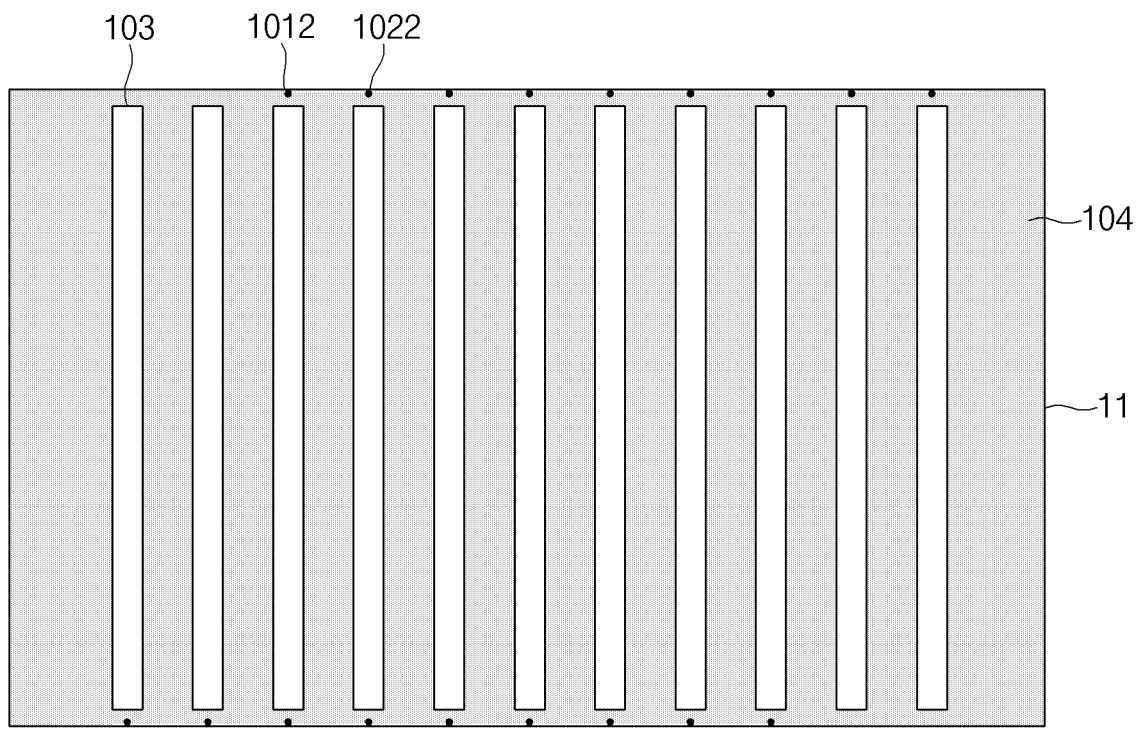
FIG. 9 is a schematic top view illustrating the state in which the filler 104 is injected into the base film 11 according to an embodiment of the present invention.

FIG. 8 is a schematic side view illustrating a state in which a filler 104 is injected into the base film 11 according to an embodiment of the present invention, and FIG. 9 is a schematic top view illustrating the state in which the filler 104 is injected into the base film 11 according to an embodiment of the present invention.

As illustrated in FIGS. 8 and 9, on the top surface of the base film 11, the filler 104 is injected into an empty space in which the micro-pillar 103 is not filled (S204). The filler 104 may be an epoxy molding composition (EMC) having electrical insulation. Thereby, the micro-pillar 103 may be encapsulated inside the insulator.

Figure 10:
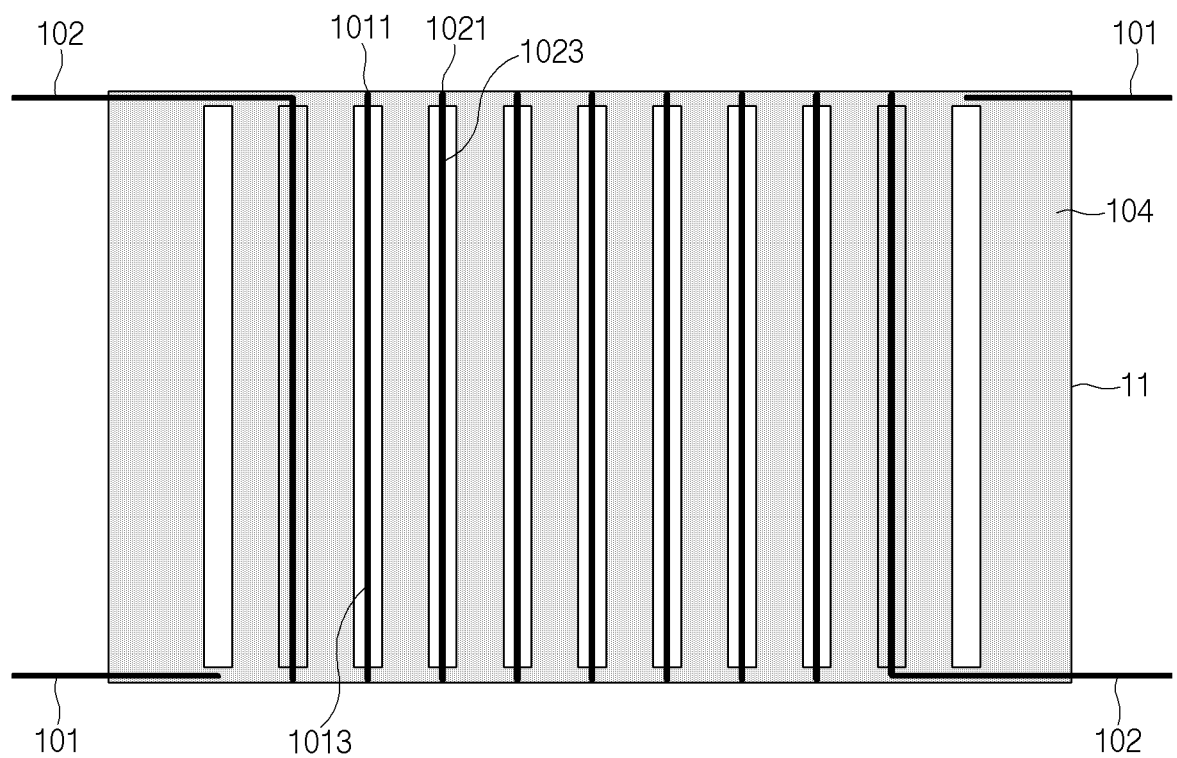
FIG. 10 is a schematic top view illustrating a state in which a first upper conductive wire 1013 and a second upper conductive wire 1023 are formed according to an embodiment of the present invention.

FIG. 10 is a schematic top view illustrating a state in which a first upper conductive wire 1013 and a second upper conductive wire 1023 are formed according to an embodiment of the present invention.

On the top surface of the micro-pillar 103, the first upper conductive wire 1013 connecting the first via conductive wires 1012 to each other and the second upper conductive wire 1023 connecting the second via conductive wires 1022 to each other are formed 5205. In addition, the first upper conductive wire 1021 and the second upper conductive wire 1023 may be formed on the top surface of the base film 11 by at least one of an etching or printing method.

The first upper conductive wire 1013 and the second upper conductive wire 1023 are all formed along the micro-pillar 103. That is, the first upper conductive wire 1013 may be formed on the top surface of the micro-pillar 103 on which the first via conductive wire 1012 is formed, while connecting the first via conductive wires 1012 to each other, the second upper conductive wire 1023 may be formed on the top surface of the micro-pillar 103 on which the second via conductive wire 1022 is formed, while connecting the first via conductive wires 1012 to each other. At this time, the first upper conductive wire 1013 and the second upper conductive wire 1023 may be formed to be wider than the first via conductive wire 1012 and the second via conductive wire 1022 to be connected to the first via conductive wire 1012 and the second via conductive wire 1022, respectively.

As described above, ends of different first lower wires 1011 may be disposed on both the ends of one micro-pillar 103, respectively, or ends of different second lower wires 1021 may be disposed on both the ends of one micro-pillar 103, respectively. Therefore, the first upper conductive wire 1013 is connected to each of the different first lower conductive wires 1011 through the first via conductive wire 1012, and the second upper conductive wire 1023 is connected to each of the different second lower conductive wires 1021 through the second via conductive wire 1012, so that the first conductive wire 101 and the second conductive wire 102 may be spirally formed.

The first upper conductive wire 1013 and the second upper conductive wire 1023 are each provided in plurality, and are all formed along the micro-pillar 103, and thus, may be formed parallel to the second direction. It is preferable that the second direction is a direction different from the first direction. For example, as illustrated in FIG. 10, the second direction may have a predetermined inclination with respect to the first direction. In addition the first upper conductive wire 1013 and the second upper conductive wire 1023 may be alternately formed with each other. Therefore, in the pattern circuit layer 10 of the FPCB 1, the pattern fuse 100 including the first conductive wire 101 and the second lead 102 having a double helix structure may be formed embedded. Furthermore, after the pattern fuse 100 is formed, the base film 11 may be removed.

Meanwhile, although not illustrated in the drawings, in order to protect a circuit pattern of the FPCB 1, a cover lay may be laminated on the top surface of the micro-pillar 103. The cover lay may be a film of a polyimide-based material.

Figure 11:
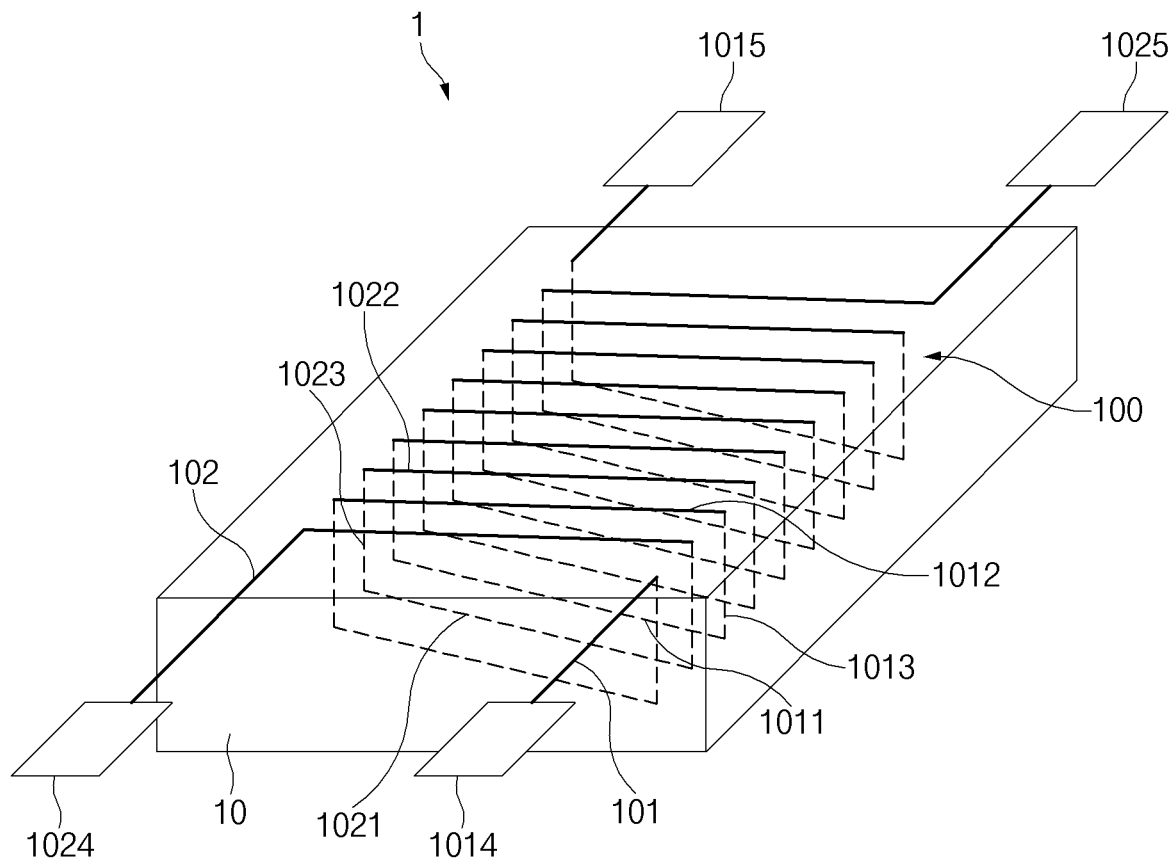
FIG. 11 is a perspective view illustrating a state in which start terminals 1014 and 1024 and end terminals 1015 and 1025 are formed on a first conductive wire 101 and a second conductive wire 102 according to an embodiment of the present invention.

FIG. 11 is a perspective view illustrating a state in which start terminals 1014 and 1024 and end terminals 1015 and 1025 are formed on a first conductive wire 101 and a second conductive wire 102 according to an embodiment of the present invention.

After the first upper conductive wire 1013 and the second upper conductive wire 1023 are formed, the start terminals 1014 and 1024 are formed at start portions of the first conductive wire 101 and the second conductive wire 102, and the end terminals 1015 and 1025 are formed at end portions thereof. At this time, the first conductive wire 101 and the second conductive wire 102 may have the start terminals 1014 and 1024 and the end terminals 1015 and 1025 all exposed only on one of the top surface or the bottom surface of the pattern circuit layer 10.

In addition, according to an embodiment of the present invention, the first conductive wire 101 and the second conductive wire 102 have the start terminals 1014 and 1024 and the end terminals 1015 and 1025 all separately formed. That is, as illustrated in FIG. 11, at the start portion of the first conductive wire 101, a first start terminal 1014 is formed, and at the start portion of the second conductive wire 102, a second start terminal 1024 is separately formed. In addition, at the end portion of the first conductive wire 101, a first end terminal 1015 is formed, and at the end portion of the second conductive wire 102, a second end terminal 1025 is separately formed.

Figure 12:
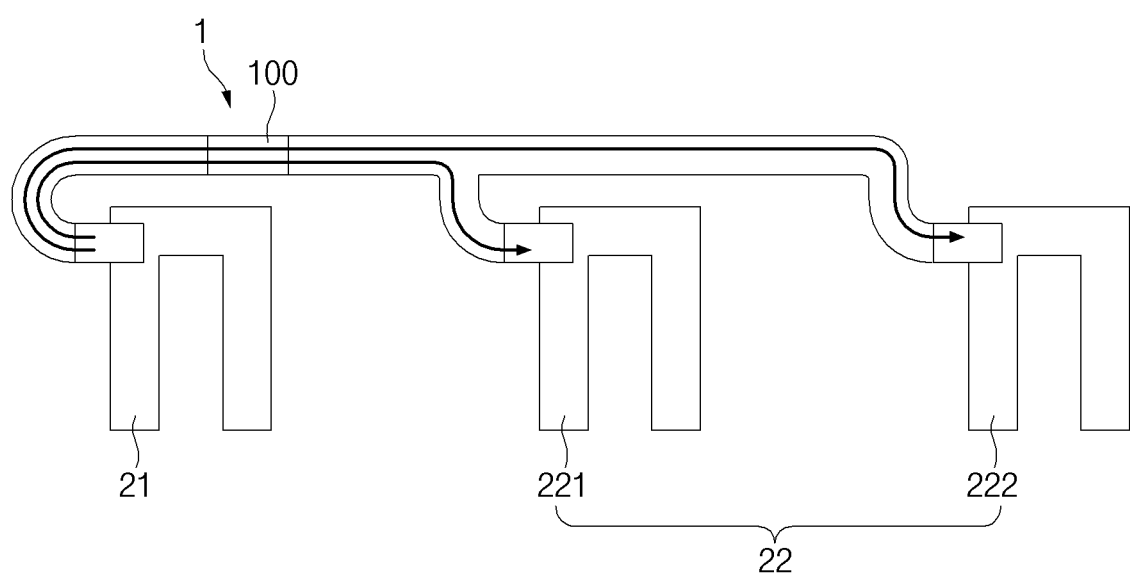
FIG. 12 is a schematic view illustrating a state in which bus bars 21 and 22 are connected to the pattern fuse 100 according to an embodiment of the present invention.

FIG. 12 is a schematic view illustrating a state in which bus bars 21 and 22 are connected to the pattern fuse 100 according to an embodiment of the present invention.

If at least one of the first start terminal 1014, the second start terminal 1024, the first end terminal 1015, or the second end terminal 1025 is exposed on another surface of the pattern circuit layer 10, in order to be connected to the bus bars 21 and 22, the upper and bottom surfaces of the FPCB 1 should be bent to be inverted from each other. Then, a process of bending the FPCB 1 should be further added, and there is also a problem in that the durability of a bent portion is degraded to cause lifespan to be shortened.

The first start terminal 1014 of the first conductive wire 101 and the second start terminal 1024 of the second conductive wire 102 are, as illustrated in FIG. 12, connected to one power bus bar 21. However, according to an embodiment of the present invention, the first start terminal 1014 and the second start terminal 1024 are all exposed on the same surface of the pattern circuit layer 10, so that when connected to the power bus bar 21, the top surface and the bottom surface of the FPCB 1 are not required to be bent to be inverted from each other.

In addition, the first end terminal 1015 of the first conductive wire 101 and the second end terminal 1025 of the second conductive wire 102 are connected to different sensing bus bars 221 and 222, respectively. However, the first end terminal 1015 and the second end terminal 1025 are all exposed on the same surface of the pattern circuit layer 10, so that when connected to the sensing bus bar 22, the top surface and the bottom surface of the FPCB 1 are not required to be bent to be inverted from each other.

Figure 13:
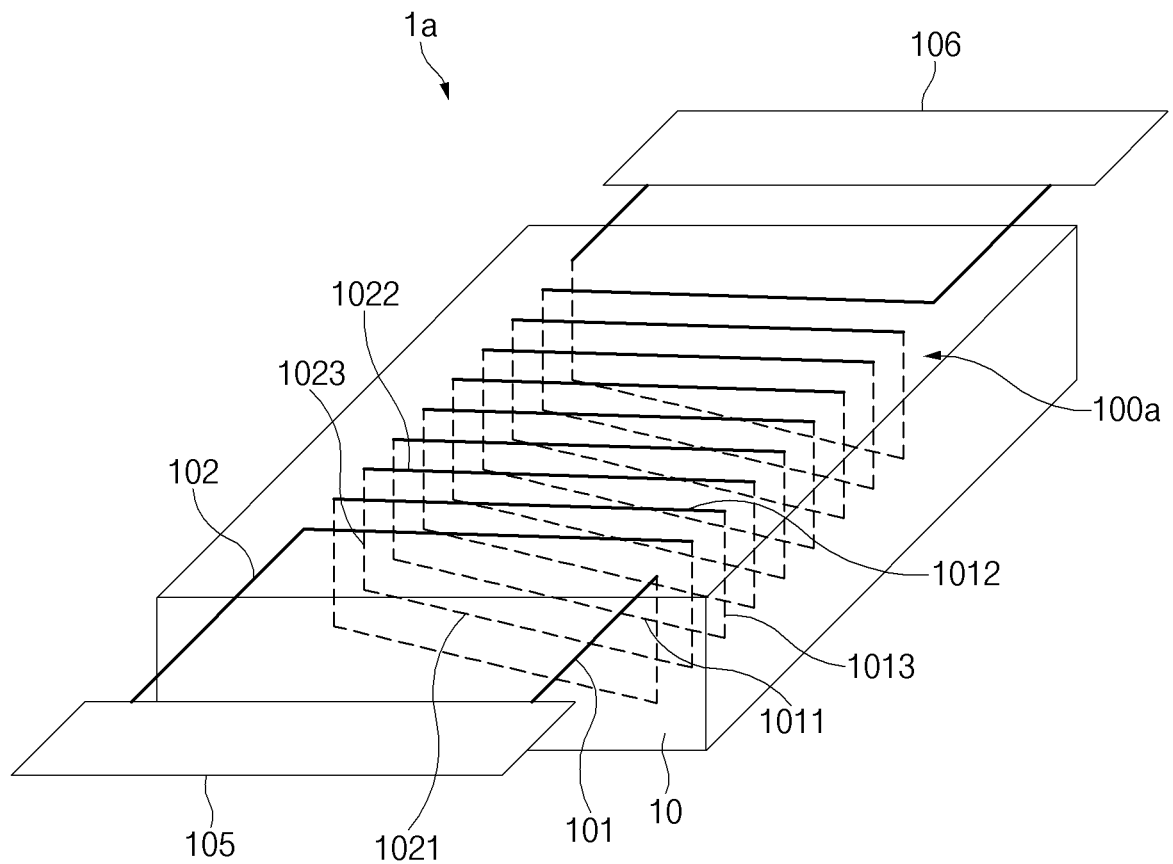
FIG. 13 is a perspective view illustrating the state in which a start terminal 105 and an end terminal 106 are formed on the first conductive wire 101 and the second conductive wire 102 according to another embodiment of the present invention.

FIG. 13 is a perspective view illustrating the state in which a start terminal 105 and an end terminal 106 are formed on the first conductive wire 101 and the second conductive wire 102 according to another embodiment of the present invention.

According to another embodiment of the present invention, the first conductive wire 101 and the second conductive wire 102 have the start terminal 105 and the end terminal 106 formed respectively connected to each other. That is, as illustrated in FIG. 13, a first start terminal formed in a start portion of the first conductive wire 101 and a second start terminal formed in a start portion of the second conductive wire 102 are formed connected to each other. In addition, a first end terminal formed in an end portion of the first conductive wire 101 and a second end terminal formed in an end portion of the second conductive wire 102 are formed connected to each other. Particularly, as illustrated in FIG. 13, the first start terminal and the second start terminal may be integrally formed as one start terminal 105, and the first end terminal and the second end terminal may be integrally formed as one end terminal 106. However, the present invention is not limited thereto. The first start terminal and the second start terminal and the first end terminal and the second end terminal may be separately formed and then bonded to each other through a separate bonding part (not shown), or may be connected to each other through welding or an adhesive. In addition, the first conductive wire 101 and the second conductive wire 102 may have the start terminal 105 and the end terminal 106 all exposed only on one of the top surface or the bottom surface of the pattern circuit layer 10.

Figure 14:
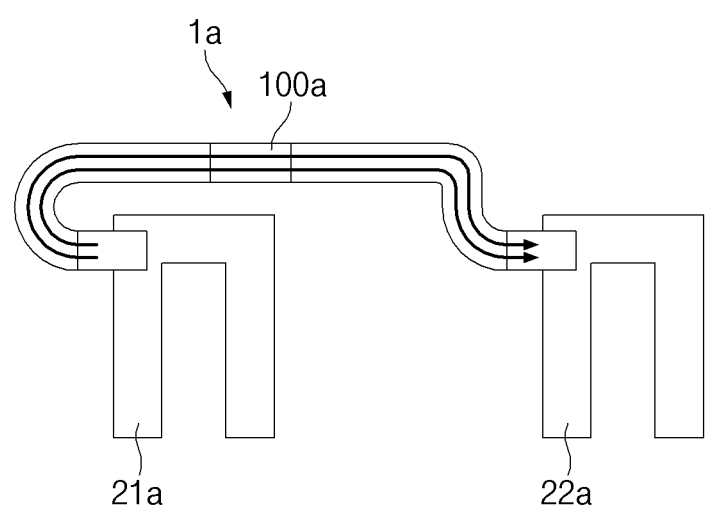
FIG. 14 is a schematic view illustrating a state in which bus bars 21a and 22a are connected to a pattern fuse 100a according to another embodiment of the present invention.

FIG. 14 is a schematic view illustrating a state in which bus bars 21a and 22a are connected to a pattern fuse 100a according to another embodiment of the present invention.

The start terminals 105 of the first conductive wire 101 and the second conductive wire 102 are formed connected to each other, and thus, are connected to one power bus bar 21a as illustrated in FIG. 14. However, the first start terminal and the second start terminal are all exposed on the same surface of the pattern circuit layer 10 and then connected to each other, so that when connected to the power bus bar 21a, an top surface and a bottom surface of an FPCB 1a are not required to be bent to be inverted from each other.

In addition, the end terminals 106 of the first conductive wire 101 and the second conductive wire 102 are also formed connected to each other, and thus, are connected to one sensing bus bar 22a. However, the first end terminal and the second end terminal are all exposed on the same surface of the pattern circuit layer 10, so that when connected to the sensing bus bar 22a, the top surface and the bottom surface of the FPCB 1a are not required to be bent to be inverted from each other.

Those of ordinary skill in the art to which the present invention pertains will understand that the present invention may be embodied in other specific forms without changing the technical spirit or essential features thereof. It is therefore to be understood that the above-described embodiments are illustrative in all aspects and not restrictive. The scope of the present invention is represented by the following claims rather than the above detailed description, and various embodiments derived from the meaning and scope of the claims and their equivalent concepts should be construed as being included in the scope of the present invention.

DESCRIPTION OF THE REFERENCE NUMERALS OR SYMBOLS

1: FPCB 2: Bus bar
10: Pattern circuit layer 11: Base film
21: Power bus bar 22: Sensing bus bar
100: Pattern fuse 101: First conductive wire
102: Second conductive wire 103: Micro-pillar
104: Filler 1011: First lower conductive wire
1012: First via conductive wire 1013: First upper conductive wire
1014: First start terminal 1015: First end terminal
1021: Second lower conductive wire 1022: Second via conductive wire
1023: Second upper conductive wire 1024: Second start terminal
1025: Second end terminal

The invention claimed is:

1. A flexible printed circuit board (FPCB) comprising:
a pattern circuit layer, wherein the pattern circuit layer has a pattern fuse embedded therein, and the pattern fuse comprises:
 a first conductive metal wire; and
 a second conductive metal wire,
wherein the first conductive metal wire and the second conductive metal wire are arranged in a double helix structure.

2. The FPCB of claim 1, wherein the first conductive metal wire comprises:
a first lower conductive wire positioned on a bottom surface of the pattern circuit layer;
a first upper conductive wire positioned on a top surface of the pattern circuit layer; and
a first via conductive wire connecting the first lower conductive wire and the first upper conductive wire to each other, and
the second conductive metal wire comprises:
a second lower conductive wire positioned on the bottom surface of the pattern circuit layer;
a second upper conductive wire positioned on the top surface of the pattern circuit layer; and
a second via conductive wire connecting the second lower conductive wire and the second upper conductive wire to each other.

3. The FPCB of claim 2, wherein each of the first conductive metal wire and the second conductive metal wire is arranged in a helical quadrangular shape.

4. The FPCB of claim 3, wherein each of the first lower conductive wire, the second lower conductive wire, the first upper conductive wire, and the second upper conductive wire is straight.

5. The FPCB of claim 3, wherein each of the first via conductive wire and the second via conductive wire is straight and extends longitudinally in a thickness direction of the pattern circuit layer.

6. The FPCB of claim 1, wherein each of the first conductive wire and the second conductive wire has a start terminal and an end terminal, wherein each start terminal and each end terminal is exposed on only one of a top surface or a bottom surface of the pattern circuit layer.

7. The FPCB of claim 6, wherein the start terminal of the first conductive metal wire and the start terminal of the second conductive metal wire are spaced apart from each other, and
the end terminal of the first conductive metal wire and the end terminal of the second conductive metal wire are spaced apart from each other.

8. The FPCB of claim 6, wherein the start terminal of the first conductive metal wire and the start terminal of the second conductive metal wire are connected to each other, and
the end terminal of the first conductive metal wire and the end terminal of the second conductive metal wire are connected to each other.

9. The FPCB of claim 6, wherein each of the start terminals is connected to a power bus bar and each of the end terminals is connected to a sensing bus bar.

10. The FPCB of claim 9, wherein the end terminal of the first conductive metal wire is connected to a first sensing bus bar, and the end terminal of the second conductive metal wire is connected to a second sensing bus bar.

11. The FPCB of claim 1, wherein each of the first conductive metal wire and the second conductive metal wire comprises at least one of silver, copper, gold, or aluminum.

12. The FPCB of claim 1, wherein the FPCB further comprises a cover lay laminated on a top surface of the pattern circuit layer.

13. A method for manufacturing the FPCB of claim 1, the method comprising:
forming a first lower conductive wire and a second lower conductive wire on a top surface of a base film;
exposing both ends of the first lower conductive wire and the second lower conductive wire;
laminating a micro-pillar on the top surface of the base film;
forming a first via conductive wire and a second via conductive wire on both the ends of the first lower conductive wire and the second lower conductive wire, respectively;
injecting a filler into an empty space in which the micro-pillar is not filled on the top surface of the base film; and
forming a first upper conductive wire connected to the first via conductive wire and a second upper conductive wire connected to the second via conductive wire on a top surface of the micro-pillar.

14. The method of claim 13, wherein the first lower conductive wire and the second lower conductive wire are formed parallel to a first direction.

15. The method of claim 14, wherein the first upper conductive wire and the second upper conductive wire are formed parallel to a second direction.

16. The method of claim 15, wherein the first direction and the second direction are different from each other.

17. The method of claim 13, wherein the first lower conductive wire and the second lower conductive wire are formed on the top surface of the base film by at least one of an etching or printing method.

18. The method of claim 13, wherein the first upper conductive wire and the second upper conductive wire are formed on the top surface of the micro-pillar by at least one of an etching or printing method.

19. The method of claim 13, further comprising:
  forming a first start terminal at a start portion of the first conductive metal wire comprising the first lower conductive wire, the first via conductive wire, and the first upper conductive wire;
  forming a first end terminal at an end portion of the first conductive metal wire;
  forming a second start terminal at a start portion of the second conductive metal wire comprising the second lower conductive wire, the second via conductive wire, and the second upper conductive wire; and
  forming a second end terminal at an end portion of the second conductive metal wire.

20. The method of claim 19, wherein the first and second start terminals and the first and second end terminals are formed such that they are exposed only on one of a top surface or a bottom surface of the pattern circuit layer.

\* \* \* \* \*